United States Patent [19]
Beyer

[11] Patent Number: 6,154,550
[45] Date of Patent: Nov. 28, 2000

[54] METHOD AND ARRANGEMENT FOR AUTOMATICALLY LIMITING DISTORTION IN AUDIO DEVICES

[75] Inventor: Detlev Beyer, Isenbüttel, Germany

[73] Assignee: Volkswagen AG, Wolfsburg, Germany

[21] Appl. No.: 08/936,461

[22] Filed: Sep. 24, 1997

[30] Foreign Application Priority Data

Sep. 28, 1996 [DE] Germany .......................... 196 40 132

[51] Int. Cl.[7] .................................................. H03G 3/00
[52] U.S. Cl. ............................ 381/108; 381/56; 381/94.1
[58] Field of Search ................................ 381/94.1, 94.2, 381/94.3, 94.8, 107, 108, 120, 121, 55, 56, 57, 321, 86; 333/14; 330/141

[56] References Cited

U.S. PATENT DOCUMENTS

| | | |
|---|---|---|
| 4,114,115 | 9/1978 | Minnis ....................................... 333/14 |
| 4,912,424 | 3/1990 | Nicola et al. ............................ 330/141 |
| 5,018,205 | 5/1991 | Takagi et al. . |
| 5,255,324 | 10/1993 | Brewer et al. .......................... 381/107 |

FOREIGN PATENT DOCUMENTS 4340167  6/1995  Germany .

OTHER PUBLICATIONS

EP 97 11 4179 European Search Report dated Oct. 13, 1999, 3 pp.

*Primary Examiner*—Vivian Chang
*Attorney, Agent, or Firm*—Baker Botts L.L.P.

[57] ABSTRACT

A method and arrangement for automatically limiting distortion in audio devices utilizes a distortion detector for determining a harmonic distortion factor and the output of the distortion detector is fed back to a gain regulation input of the audio device. The distortion detector determines the harmonic distortion factor of the output signal of the audio device in a frequency-dependent manner and, when the harmonic distortion factor exceeds a frequency-dependent, adjustable threshold value, the detector generates a control signal that reduces the gain of the audio device.

8 Claims, 2 Drawing Sheets

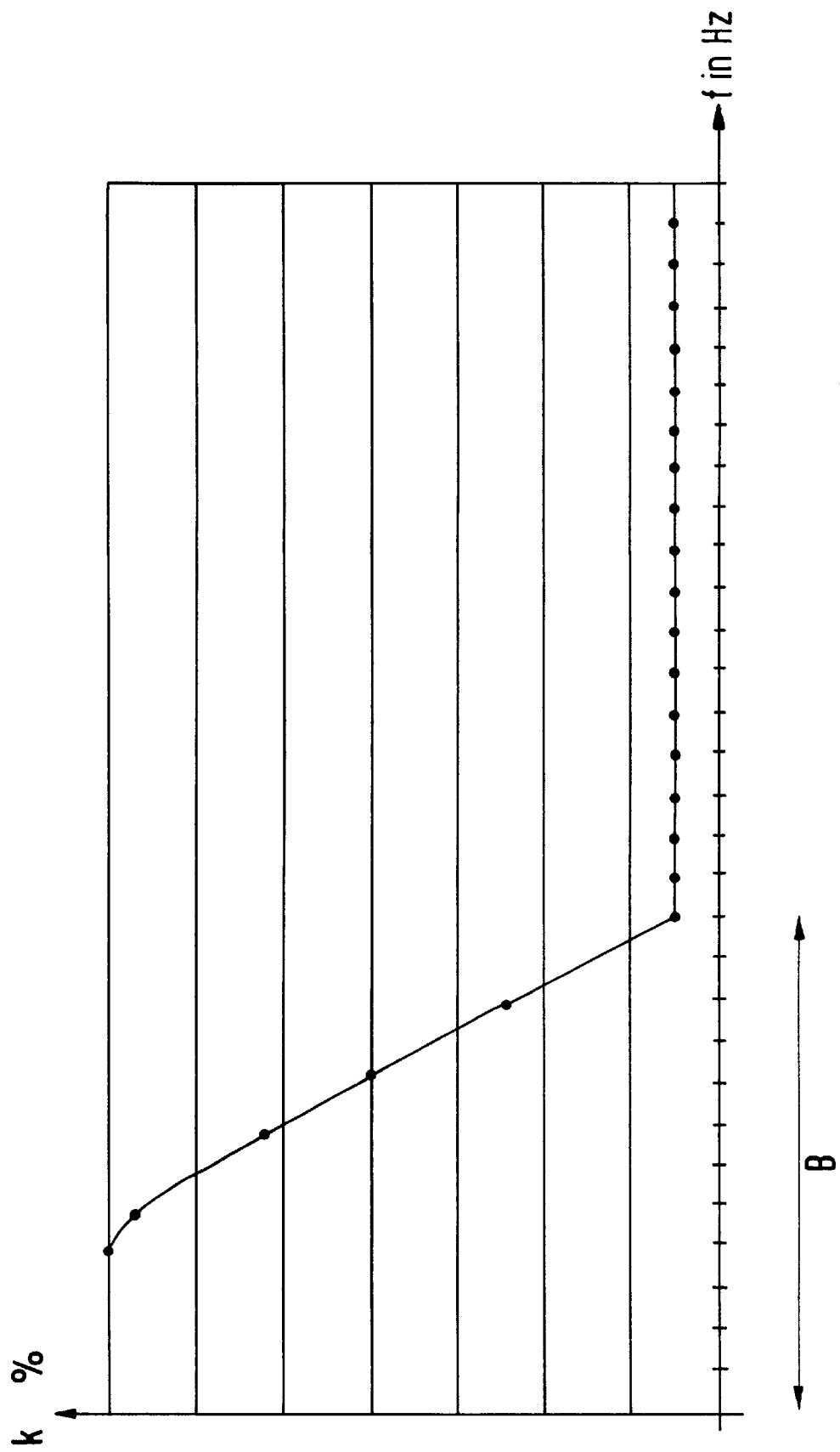

METHOD AND ARRANGEMENT FOR AUTOMATICALLY LIMITING DISTORTION IN AUDIO DEVICES

BACKGROUND OF THE INVENTION

This invention relates to methods for automatically limiting distortion in audio devices and to circuit arrangements for carrying out such methods.

Because of the great nonlinearity of the transfer characteristic of amplifiers, distortion occurs when the amplitude of an input signal is not infinitesimal. A measure of the amount of distortion is the harmonic distortion factor. The harmonic distortion factor indicates the ratio of the root-mean-square values of the harmonics and the fundamental at the output.

In car radios, in particular, the volume is frequently set so high that the output stages are overdriven and, consequently, a high harmonic distortion factor is produced. This can also occur, for example, when a switch-over is made from a signal having a relatively low frequency swing to a signal having a high frequency swing, after the volume had previously been set to an acceptable value with regard to the harmonic distortion factor. In order to avoid an excessively large harmonic distortion factor, therefore, a fixed threshold value between 0.2% and 20% harmonic distortion factor is set, and if this limit value range is exceeded, the gain of the audio device is reduced until the harmonic distortion factor again falls below the limit value of the harmonic distortion factor.

Such an apparatus is disclosed, for example, in German Offenlegungsschrifft No. 43 40 167, in which it is possible to detect at the output stage of the audio device a signal which indicates a predetermined degree of driving. The detected signal, which is passed through an integration element, provides a voltage representing the harmonic distortion factor and, based on a predetermined characteristic curve, produces a manipulated variable which is transmitted to a final control unit for the gain of the audio signals. This arrangement has the disadvantage that, when bass bursts occur, the harmonic distortion factor is exceeded and the output power of the audio signal is reduced over its entire frequency range. This results in so-called ",breathing", that is to say the overall audible volume of the audio signal varies with the rhythm of the bass bursts that occur.

U.S. Pat. No. 5,255,324 discloses an arrangement for adapting the distortion in audio devices in which the bass range is selectively observable and controllable in order to avoid "breathing". The principle is explained in more detail with reference to FIG. 2 of that patent. A fixed, frequency-independent limit value is defined for the harmonic distortion factor. If, at any signal frequency, the output signal of the audio device exceeds the limit value of the harmonic distortion factor, then a check is first made to see whether the limit value of the harmonic distortion factor in the bass range has been exceeded. If this is the case, then only the bass gain is reduced and a renewed check is made to see whether the output signal lies above the limit value. If this is the case, then a check is made to see whether the limit value of the bass range is still being exceeded. Only when the limit value of the bass range is no longer being exceeded yet the output signal still exceeds the limit value the harmonic distortion factor is the gain of the entire frequency range reduced. This arrangement has the disadvantage of complicated and slow regulation.

SUMMARY OF THE INVENTION

Accordingly, it is an object of the present invention to provide a method and an arrangement for automatically limiting distortion in audio devices which overcome the disadvantages of the prior art.

Another object of the invention is to provide a simpler method for automatically adapting distortion in audio devices and a circuit arrangement for carrying out the method.

These and other objects of the invention are attained by using a frequency-dependent determination of the harmonic distortion factor of the output signal and a frequency-dependent setting of the threshold value of the harmonic distortion factor. With this arrangement it is possible to limit the distortion in the audio device without complicated regulation procedures. As a result of the frequency-dependent setting of the threshold value of the harmonic distortion factor, it is furthermore possible to limit distortion very easily based on the individual auditory requirements of the user, the music to be reproduced and/or the surroundings of the audio device.

In a particular embodiment of the invention, it is possible to assure that the audio device is always operated with the maximum permissible gain. For this purpose, the gain is automatically increased when the harmonic distortion factor falls below the threshold value of the harmonic distortion factor until the threshold value of the harmonic distortion factor is exceeded. As a result of the constant definition of the threshold value of the harmonic distortion factor in individual frequency ranges, the method can be carried out using cost-effective digital components for checking the threshold value of the harmonic distortion factor. Since human hearing cannot perceive pulse distortions in the bass range (<400 Hz) as clearly as in the upper frequency range, selecting the threshold value of the harmonic distortion factor to be greater in the bass range than in the upper frequency range (>400 Hz) is advantageous for the overall acoustics.

In a further embodiment, the threshold value of the harmonic distortion factor is defined so that it is constant and at a large threshold value in the bass range for very low frequencies, and so that it decreases linearly or parabolically toward higher frequencies in the bass range. Above bass range, the threshold value of the harmonic distortion factor is defined so that it is again constant but at a low level. This achieves virtually optimum adaptation to the acoustic faculty of a human to perceive distortion. The invention is preferably applied to audio devices in motor vehicles.

BRIEF DESCRIPTION OF THE DRAWINGS

Further objects and advantages of the invention will be apparent from a reading of the following description in conjunction with the accompanying drawings, in which:

FIG. 2 is a graphical representation illustrating the a function of the threshold value of the harmonic distortion factor with respect to the frequency.

DESCRIPTION OF PREFERRED EMBODIMENTS

Figure 1:
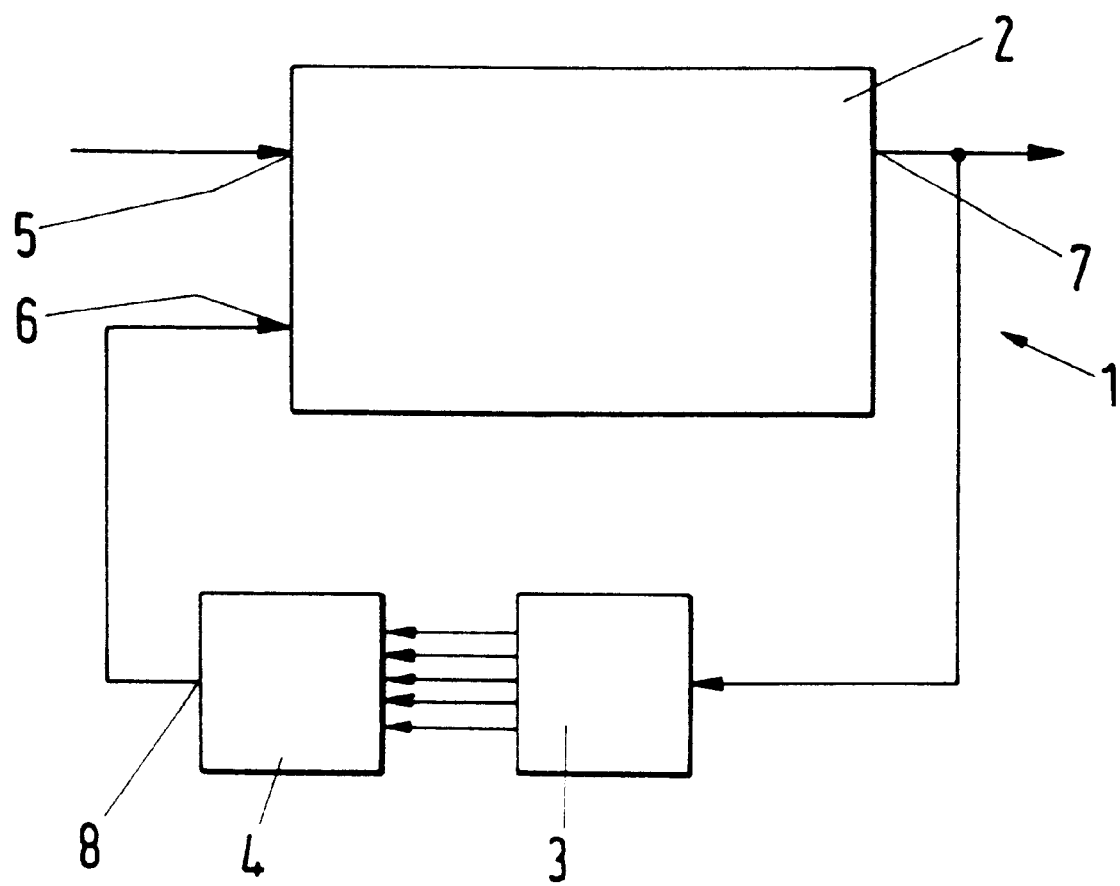
FIG. 1 is a schematic block diagram of a representative embodiment of a circuit for carrying out the invention.

In the representative embodiment of the invention shown in FIG. 1, a circuit arrangement 1 comprises an audio device 2, a frequency-selective distortion detector 3 and a comparator 4. The audio device 2 has a signal input 5, an adjustable gain regulation input 6 and a signal output 7. The signal output 7 is connected to an input of the frequency-selective distortion detector 3 which supplies outputs representing the harmonic distortion factor of the signal 7 at various frequencies to corresponding inputs of the comparator 4. An output 8 of the comparator 4 is connected to the gain regulation input 6 of the audio device.

The audio device 2 receives an audio signal at its signal input 5. This audio signal may be, for example, a frequency-modulated radio signal from an antenna. Since, however, the demodulation operation of the device is not essential for the present invention, it is assumed for the sake of simplicity that the signal at the input 5 is the audio-frequency audio signal. The audio signal is amplified in accordance with the gain signal supplied to the gain regulation input and the amplified signal is supplied from the signal output 7 to loudspeakers or booster amplifiers (not illustrated). From the output signal at the signal output 7, the distortion detector 3 determines, in a frequency-selective manner, the individual harmonic distortion factors of the output signal for each of a plurality of frequencies.

The values determined for the respective harmonic distortion factors are transmitted to the inputs of the comparator 4 where they are compared with threshold values of the harmonic distortion factor which are predetermined for each individual frequency. An example of such predetermined frequency-dependent threshold values for the harmonic distortion factor is illustrated in FIG. 2, where B indicates the bass range. If the comparison of the current values of the harmonic distortion factors of the output signal with the threshold values of the harmonic distortion factor in the comparator 4 shows that the predetermined threshold value is not exceeded at any frequency, then the gain regulation signal supplied to the input 6 is maintained or, if desired, regulated to a higher gain value. If the threshold value of the harmonic distortion factor for any frequency is exceeded, then the comparator 4 generates a manipulated variable which reduces the gain to a lower value until the threshold value of the harmonic distortion factor at that frequency is no longer exceeded. The logic arrangement of the individual output signals in the comparator 4 to determine whether the threshold value has been exceeded for an individual frequency is effected, for example, by a conventional OR function. The frequency-selective distortion detector 3 and the comparator 4 are preferably integrated in a common unit with the audio device 2.

Although the intention has been described herein with reference to specific embodiments, many modifications and variations therein will readily occur to those skilled in the art. Accordingly, all such variations and modification are included within the intended scope of the invention.

I claim:

1. A method for automatically limiting distortion in an audio device utilizing a distortion detector for determining a harmonic distortion factor and supplying a corresponding signal to a gain regulation input of the audio device, comprising:

determining in the distortion detector a plurality of harmonic distortion factors, each corresponding to one of a plurality of selected audio frequencies of an output signal of the audio device in a frequency-dependent manner, said plurality of harmonic distortion factors comprising the ratios of the root mean square values of the harmonics and the fundamentals in the output signal; and generating a control signal that reduces the overall gain of the audio device when at least one of the harmonic distortion factors exceeds the corresponding frequency-dependent, adjustable harmonic distortion factor threshold value.

2. A method for automatically limiting distortion in an audio device utilizing a distortion detector for determining a harmonic distortion factor and supplying a corresponding signal to a gain regulation input of the audio device, comprising:

determining in the distortion detector a plurality of harmonic distortion factors, each corresponding to one of a plurality of selected audio frequencies of an output signal of the audio device in a frequency-dependent manner, said plurality of harmonic distortion factors comprising the ratios of the root mean square values of the harmonics and the fundamentals in the output signal; and adjusting the overall gain of the audio device until at least one of the plurality of harmonic distortion factors reaches the corresponding frequency-dependent threshold value.

3. A method according to claim 1 or claim 2 wherein the threshold value of the harmonic distortion factor is a selected, different value for each of a plurality of frequencies.

4. A method according to claim 3 wherein the threshold value of the harmonic distortion factor is selected to be greater in a lower frequency range than in an upper frequency range.

5. A method according to claim 1 or claim 2 wherein the threshold value of the harmonic distortion factor is a selected constant in a lower frequency range, and decreases towards higher frequencies in an adjoining, middle frequency range, and is constant with frequency in an adjoining, upper frequency range, the threshold value of the harmonic distortion factor being selected to be greater in the lower frequency range than in the upper frequency range.

6. A method according to claim 5 wherein the lower and the middle frequency ranges constitute the bass range.

7. A circuit arrangement for automatically limiting distortion in an audio device comprising:

an audio device; and a frequency selective distortion detector which receives an output of the audio device and determines a plurality of harmonic distortion factors, each corresponding to one of a plurality of selected audio frequencies, said plurality of harmonic distortion factors comprising the ratios of the root mean square values of the harmonics and the fundamentals at the output; and a plurality of comparators responsive to a plurality of determined harmonic distortion factors in corresponding individual audio frequency ranges having independent threshold values for a corresponding harmonic distortion factor, arranged in a feedback path from the output of the audio device which supplies an overall gain regulation signal to a gain control input of the audio device.

8. A motor vehicle audio device containing the circuit arrangement according to claim 7.

* * * * *